United States Patent
Meyer et al.

(10) Patent No.: US 10,122,420 B2
(45) Date of Patent: Nov. 6, 2018

(54) WIRELESS IN-CHIP AND CHIP TO CHIP COMMUNICATION

(71) Applicant: Intel IP Corporation, Santa Clara, CA (US)

(72) Inventors: Thorsten Meyer, Regensburg (DE); Andreas Augustin, Munich (DE); Reinhard Golly, Ottobrunn (DE); Peter Baumgartner, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/979,185

(22) Filed: Dec. 22, 2015

(65) Prior Publication Data
US 2017/0180014 A1    Jun. 22, 2017

(51) Int. Cl.
| | |
|---|---|
| H04B 5/00 | (2006.01) |
| H01L 23/522 | (2006.01) |
| H01L 23/528 | (2006.01) |
| H01L 25/065 | (2006.01) |

(52) U.S. Cl.
CPC ......... *H04B 5/0081* (2013.01); *H01L 23/528* (2013.01); *H01L 23/5227* (2013.01); *H01L 25/0657* (2013.01); *H04B 5/0031* (2013.01); *H01L 2224/16145* (2013.01); *H01L 2224/16227* (2013.01); *H01L 2224/1703* (2013.01); *H01L 2225/06513* (2013.01); *H01L 2924/15311* (2013.01)

(58) Field of Classification Search
CPC .................................................. H04B 5/0081
USPC ......................................................... 455/41.1
See application file for complete search history.

(56) References Cited

U.S. PATENT DOCUMENTS

| | | | | |
|---|---|---|---|---|
| 6,967,347 | B2 * | 11/2005 | Estes | B82Y 10/00 257/25 |
| 7,202,755 | B2 | 4/2007 | Tabatabai | |
| 2007/0178766 | A1 * | 8/2007 | Banerjee | H01L 23/66 439/638 |
| 2009/0267084 | A1 | 10/2009 | Bilger et al. | |
| 2010/0061056 | A1 | 3/2010 | Searls et al. | |
| 2011/0256663 | A1 | 10/2011 | Hollis | |

(Continued)

OTHER PUBLICATIONS

"International Application Serial No. PCT/US2016/062436, International Search Report dated Apr. 28, 2017", 4 pgs.

(Continued)

*Primary Examiner* — Nay A Maung
*Assistant Examiner* — Angelica M Perez
(74) *Attorney, Agent, or Firm* — Schwegman Lundberg & Woessner, P.A.

(57) ABSTRACT

Apparatus and methods are provided for wireless communications between integrated circuits or integrated circuit dies of an electronic system. In an example, an apparatus can include a first integrated circuit die including a plurality of integrated circuit devices, a second integrated circuit die including a second plurality of integrated circuit devices, and a conductor device configured to wirelessly receive a signal from the first integrated circuit die, to conduct the signal from a first end of an electrical conductor of the conductor device to a second end of the electrical conductor, and to wirelessly transmit the signal to the second integrated circuit die from the second end of the electrical conductor.

19 Claims, 5 Drawing Sheets

(56) References Cited

U.S. PATENT DOCUMENTS

| | | | |
|---|---|---|---|
| 2013/0106673 A1* | 5/2013 | McCormack | H01L 23/66 343/893 |
| 2013/0334707 A1 | 12/2013 | Tang et al. | |
| 2014/0036464 A1* | 2/2014 | Kilger | H01L 23/49822 361/767 |
| 2015/0130534 A1 | 5/2015 | Droege et al. | |
| 2015/0325501 A1* | 11/2015 | Sutton | H01L 23/49503 257/676 |
| 2016/0344084 A1 | 11/2016 | Ghassemi | |

OTHER PUBLICATIONS

"International Application Serial No. PCT/US2016/062436, Written Opinion dated Apr. 28, 2017", 4 pgs.

"International Application Serial No. PCT/US2016/062436, International Preliminary Report on Patentability dated Jul. 5, 2018", 6 pgs.

\* cited by examiner

WIRELESS IN-CHIP AND CHIP TO CHIP COMMUNICATION

TECHNICAL FIELD

The disclosure herein relates generally to wireless communication and more particularly to inter and intra communications wireless communications.

BACKGROUND

Electronics continue to be developed that are smaller yet more powerful computationally and functionally. Opportunities and challenges continue to arise that push the creative enterprise of electronic designers to provide small powerful electronic products that provide desired user functionality in a convenient package. Signal distribution can significantly impact integrated circuit and integrated circuit system design, especially as such circuits and system continue to physically shrink.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Multiple chip circuits, meaning electronic packages that include more than one active die, have become a trend and look to continue being a platform for the future. Considerable design resources can be expended in stacking chips especially in designing connections using through silicon vias (TSVs). Side by side and opossum configurations can provide options for TSVs, however, the number of possible external connections per square millimeter as well as the number of possible traces per millimeter is limited due to limited design rules of substrates and boards as the die and accompanying package shrink. Design of side by side packages desire that the connection physical signal connections between be position as much as possible in the area between the two dies. One constraint that can interfere with this desire is area for electrostatic discharge (ESD) protection which is often used with solder interconnects. In Opossum stacking configurations, the area for connections and the routing capability on the die can be limited due to the opossum (daughter) die, mounted on the mother die.

The present inventors have recognized an elegant interconnect system that does not require ESD structures, does not consume much area per connection on the package exterior and can provide better signal performance. In certain examples, the system can reduce the physical traces or interconnects between chips, as well as, between areas of a single chip while still exchanging the information that would have been communicated over such trances of interconnects.

Figure 1:
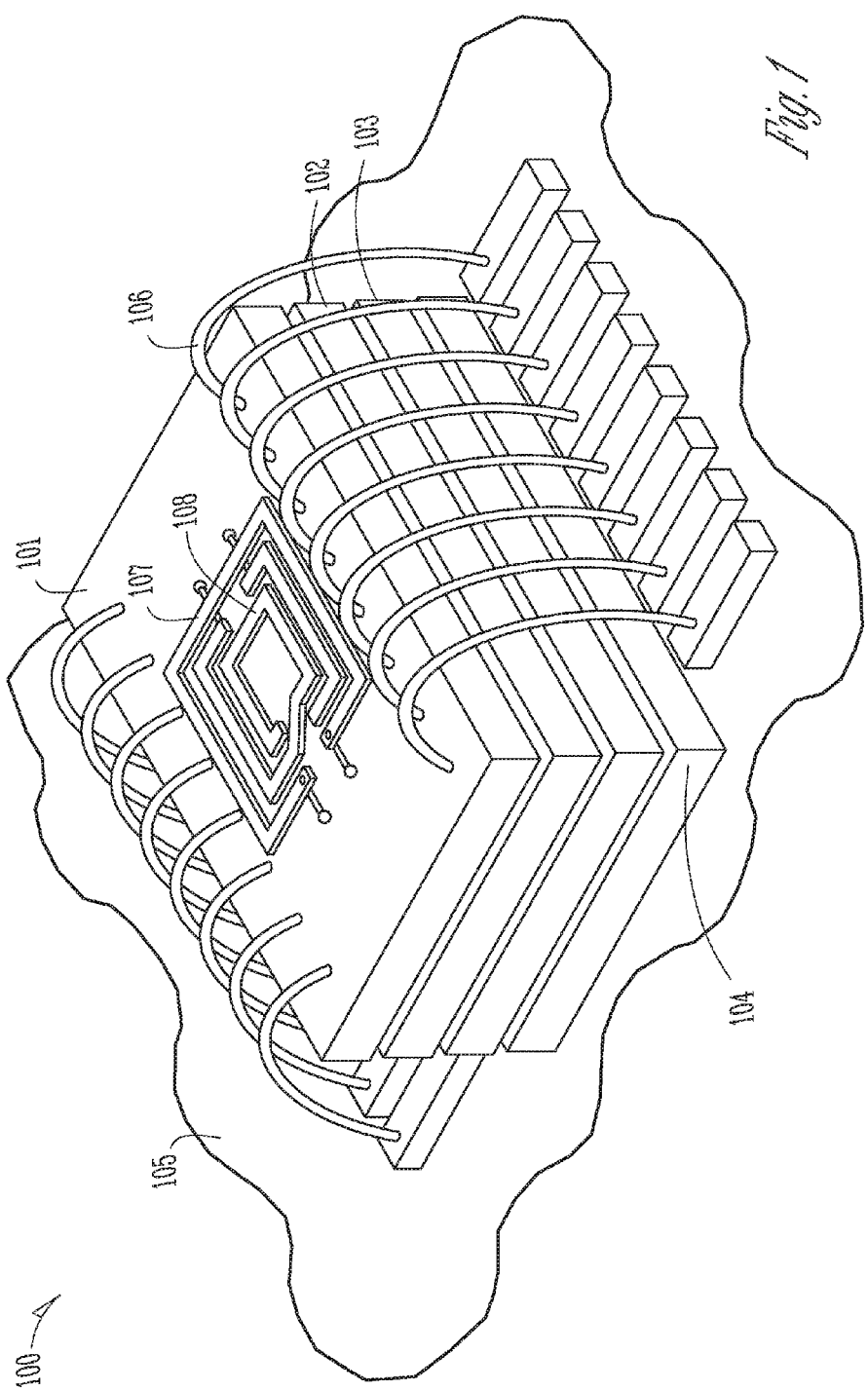
FIG. 1 illustrates a stacked chip system with an existing wireless chip-to-chip communication concept.

FIG. 1 illustrates a stacked chip system 100 with an existing wireless chip-to-chip communication concept. The stacked chip system can include a plurality of chips 101, 102, 103, 104, stacked on each other and mounted on a printed circuit board 105. In some examples, connections to the printed circuit board 105 can include solder connection to the bottom chip 104 and wire bond connections 106 to exposed terminal of the top chip 101 or one of the other chips 102, 103 having exposed terminals. Flat loop antennas 107, 108 can be mounted on at least two of the chips. A pair of loop antennas 107, 108 mounted on a chip 101 can include an antenna 107 for transmission and an antenna 108 for reception. When the chips 101, 102, 103, 104 are stacked, the antennas 107, 108 over lay antennas (not shown) mounted on another chip of the stack such that signals can be exchanged between the chips. Such a system works well for stacked chips that have a size commensurate with the size required for the loop antennas. However, for side-by-side and opossum chip configurations, such a system can be impractical because the size constraints, and distance and orientation limitations of the antennas required to provide robust communications.

Figure 2:
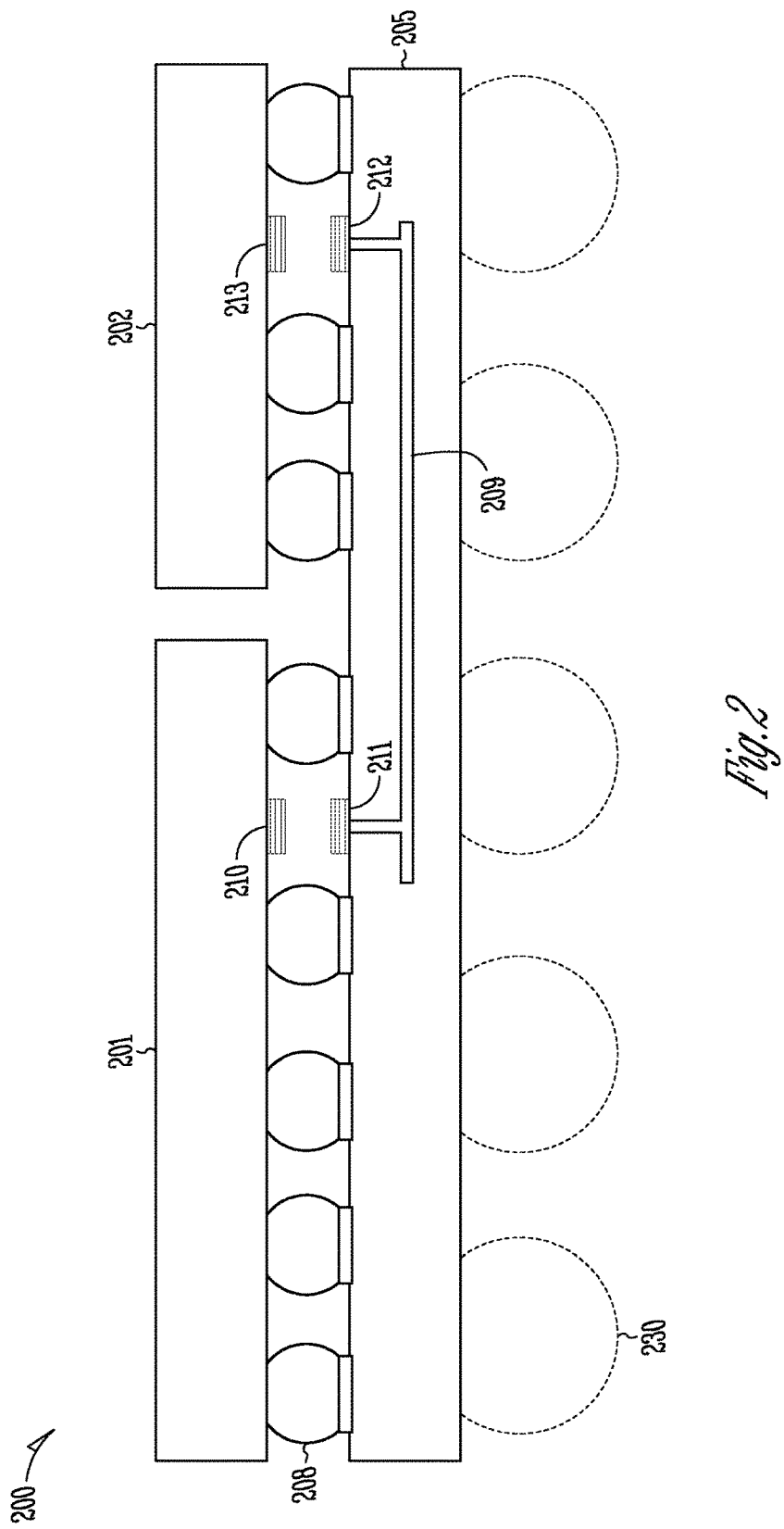
FIG. 2 illustrates generally an example system for wireless inter-chip communications.

FIG. 2 illustrates generally an example system 200 for wireless inter-chip communications. In certain examples, the system can include a substrate such as a semiconductor or silicon-based substrate, a printed circuit board (PCB) 205 or another chip, a first integrated circuit package 201 and a second integrated circuit package 202. In certain examples, the first and second integrated circuit packages 201, 202 can physically connect to traces of the substrate or PCB 205 for example via solder balls 208 or wire bonds. In an example, a signal can be transferred wirelessly from the first integrated circuit package 201 to a trace 209 of the PCB 205. The signal can be conducted through the trace 209 of the PCB 205 to another point. At the other point, the signal can be wirelessly transferred to the second integrated circuit package 202 using a pair of couplers 210. In certain examples, this wireless transfer of the signal can be achieved by the use of couplers 210, 211, 212, 213 that include coils or inductive lines. In certain examples, the trace 209 of the PCB can be directly coupled to a first coupler 211 at one end and a second coupler 212 at the other end. Such a system does not use ESD protection as such protection is typically used for solder trace connections to compensate or reduce line parasitic associated with the physically coupled wire media. In addition, a system according the present subject matter does not use additional amplifiers to drive the trace 209. Robust conduction over long trace runs can be accomplished using thicker or broader traces 209 of the PCB 205. In certain example, the couplers 211, 212 of the substrate or PCB 205 and the traces 209 can be referred to as a conductive device.

Transferring signals between chips as illustrated in FIG. 2 can significantly reduce package size as the number of external connections can be reduced and chip spacing can be more compact in some examples because of the reduction in trace routing real estate between the chips that can result from the decrease in external connections of each chip or integrated circuit package 201, 202. In some examples, the reduction in traces resulting from the reduction in external package connections can also result in a less complex PCB 205 such that the PCB 205 can be reduced in size, number of layers, and number of interlayer connections. In certain examples, more efficient use of the PCB can result from using areas under each of the first integrated circuit package 201 and the second integrated circuit package 202 for traces.

Figure 3:
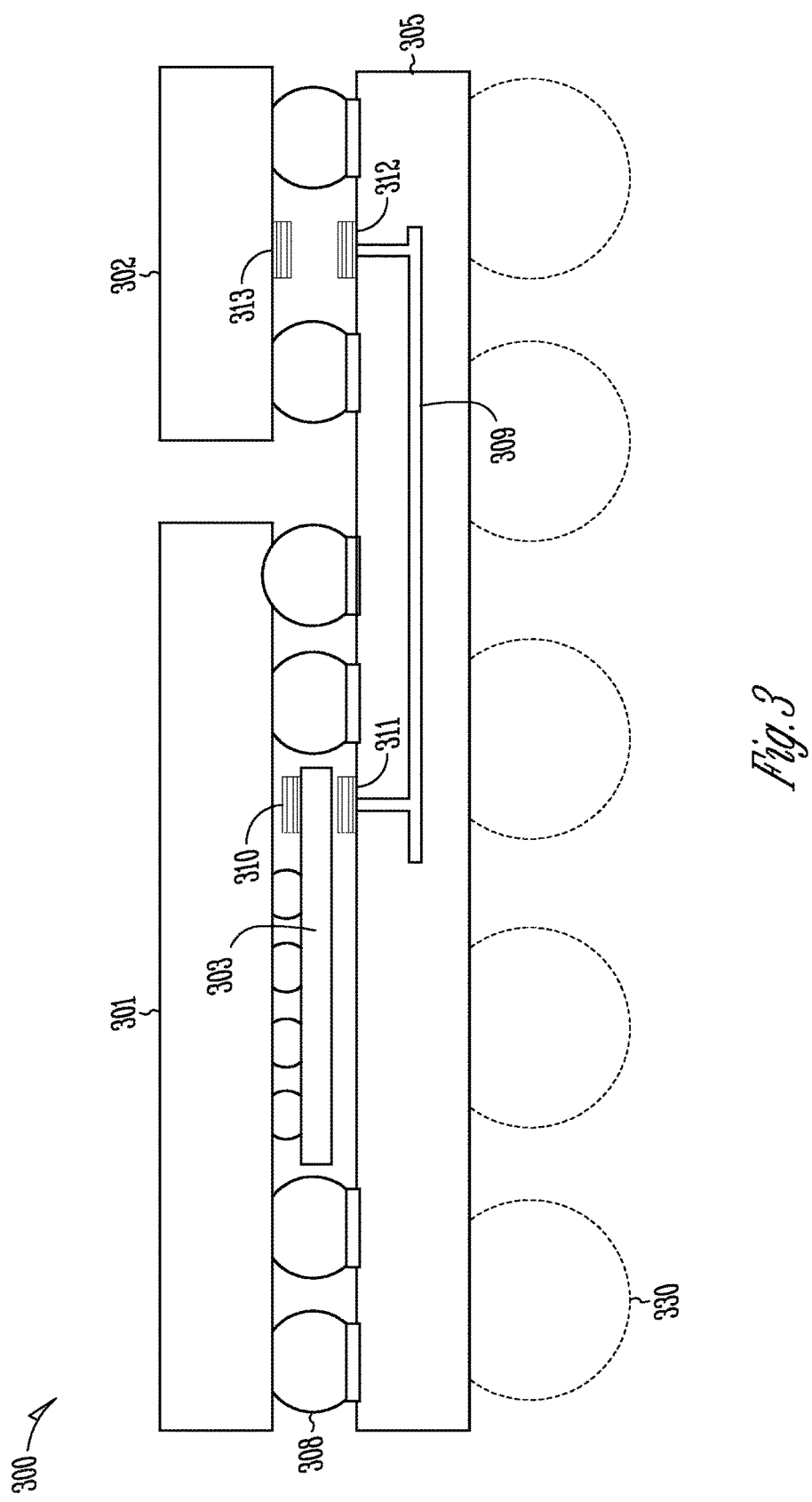
FIG. 3 illustrates generally an example system for wireless inter-chip communications.

FIG. 3 illustrates generally an example system 300 for wireless inter-chip communications. In certain examples, the system 300 can include a substrate 305 such as a printed circuit board (PCB) or another chip, a first integrated circuit package 301, a second integrated circuit package 302, and a third integrated circuit package 303. In certain examples, the first and second integrated circuit packages 301, 302 can physically connect to traces of the substrate 305 for example via solder balls 308 or wire bonds. As illustrated, the third integrated circuit package 303 can be mounted to and underneath the first integrated circuit package 301 such that the third integrated circuit package 303 is positioned between the first integrated circuit package 301 and the substrate 305. Such a mounting arrangement can be referred to as an opossum mount of the third integrated circuit package 303 to the first integrated circuit package 301. In such a mounting arrangement, the first integrated circuit package 301 can sometimes be referred to as a "mother chip" and the third integrated circuit package 303 can sometimes be referred to as a "daughter chip". In some designs, an opossum mount is disregarded the daughter chip consumes a significant amount of external connection area of the mother chip.

In certain examples, a signal can be transferred wirelessly from the third integrated circuit package 303 to a trace 309 of the substrate 305 using a first pair of couplers 310, 311, for example. The signal can be conducted through the trace 309 of the substrate 305 to another point. At the other point, the signal can be wirelessly transferred to the second integrated circuit package 302 using a second pair of couplers 312, 313. In certain examples, this wireless transfer of the signal can be achieved by the use of couplers 310, 311, 312, 313 that include coils or inductive lines. In certain examples, the trace 309 of the substrate 305 can be directly coupled to a first coupler 311 at one end and a second coupler 312 at the other end. Such a system does not use ESD protection as such protection is typically used for solder trace connections to compensate or reduce line parasitic associated with the physically coupled wire media. In addition, a system according the present subject matter does not use additional amplifiers to drive the trace 309. Robust conduction over long trace runs can be accomplished using thicker or broader traces of the substrate 305.

Transferring signals between chips as illustrated in FIG. 3 can significantly reduce package size as the number of external connections can be reduced and chip spacing can be more compact in some examples because of the reduction in trace routing real estate between the chips that can result from the decrease in external connections of each chip or integrated circuit package 301, 302. In some examples, the reduction in traces resulting from the reduction in external package connections can also result in a less complex PCB or substrate 305 such that the PCB or substrate 305 can be reduced in size, number of layers, and number of interlayer connections. In certain examples, more efficient use of the PCB can result from using areas under each of the first and third integrated circuit packages 301, 303 and the second integrated circuit package 302 for traces.

Figure 4:
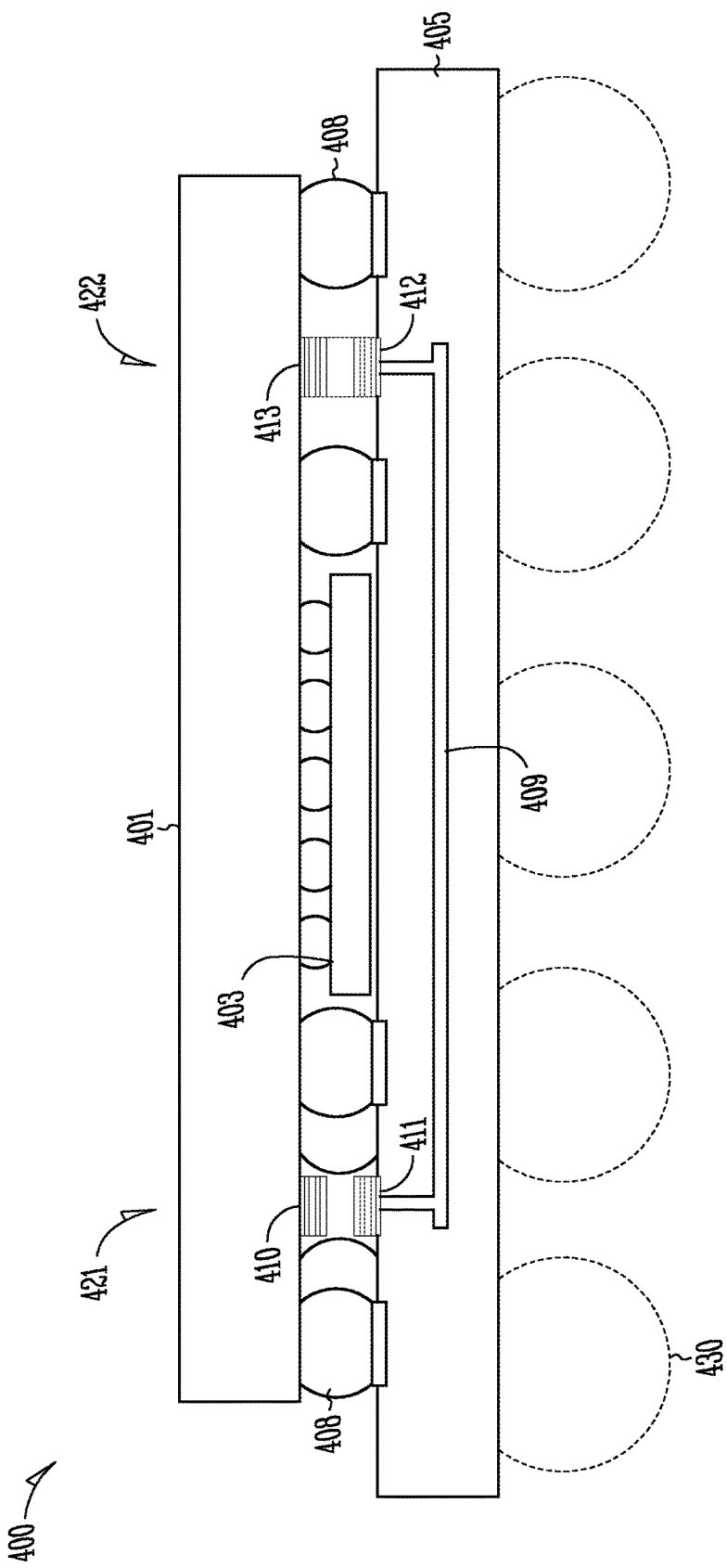
FIG. 4 illustrates generally an example system for wireless intra-chip communications.

FIG. 4 illustrates generally an example system 400 for wireless intra-chip communications. In certain examples, the system 400 can include a substrate 405 such as a printed circuit board (PCB) or another chip and a first integrated circuit package 401. In certain examples, the first integrated circuit package 401 can physically connect to traces of the substrate 405 for example via solder balls 408 or wire bonds. As illustrated, an optional second integrated circuit package 403 can be mounted to and underneath the first integrated circuit package 401 such that the second integrated circuit package 403 is positioned between the first integrated circuit package 401 and the substrate 405.

In certain examples, a signal can be transferred wirelessly from a first location 421 of the first integrated circuit package 401 to a trace 409 of the substrate 305. The signal can be conducted through the trace 409 of the substrate 405 to a second location 422 of the first integrated circuit package 401 and vice versa. At the first location 421, the signal can be wirelessly transferred between the first integrated circuit package 401 and the trace 409 using a first pair of couplers 410, 411. At the second location 422, the signal can be wirelessly transferred between the first integrated circuit package 401 and the trace 409 using a second pair of couplers 412, 413. In certain examples, this wireless transfer of the signal can be achieved by the use of couplers 410, 411, 412, 413 that include coils or inductive lines. In certain examples, the trace 409 of the substrate 405 can be directly coupled to a first coupler 411 at one end of the trace 409 and a second coupler 412 at the other end of the trace 409. Such a system does not use ESD protection as such protection is typically used for solder trace connections to compensate or reduce line parasitic associated with the physically coupled wire media. In addition, a system according the present subject matter does not use additional amplifiers to drive the trace 409. Robust conduction over long trace runs can be accomplished using thicker or broader traces of the substrate 405. Transferring signals between areas of the first integrated circuit package 401 as illustrated in FIG. 4 can significantly reduce package size as the number of routings internal to the first integrated circuit package 401 can be reduced. In certain examples, including those of FIGS. 2-4, the substrate 205, 305, 405 can optionally include connections, such as solder balls 230, 330, 430, for electrically mounting to other components of a system.

In certain examples, pairs of couplers can be separated by an air gap. In some examples, first underfill 423 or a paste, such as a non-conductive paste, can be used to physically couple a pair of couplers 410, 411. In certain examples, underfill 423, 424 or paste material can be selected to enhance wireless coupling of the pairs of couplers 410, 411, 412, 413. In some examples, the underfill 423 or paste material can be applied to encapsulate the couplers 410, 411. In some examples, the underfill 424 or paste material can be sized and shaped to couple to a surface of each coupler of the pair of couplers 412, 413.

It is understood that other integrated circuit arrangement can realize benefits of the present subject matter. Such arrangements include those discussed and shown above as well as, but not limited to, providing a hybrid wireless/wired communication link between stacked integrated circuit devices, between mother and daughter integrated circuits, between mother and other side-by-side mounted integrated circuits, between different location of a daughter integrated circuit, between a first mother integrated circuit die and a second daughter integrated circuit die mounted to second mother integrated circuit die, etc. In certain examples, including the examples, of FIGS. 1-4, the hybrid wireless/wired signal system does not require ESD structures for the connections, the system has lower parasitics, and the chips and the substrate can have less routing layers.

Figure 5:
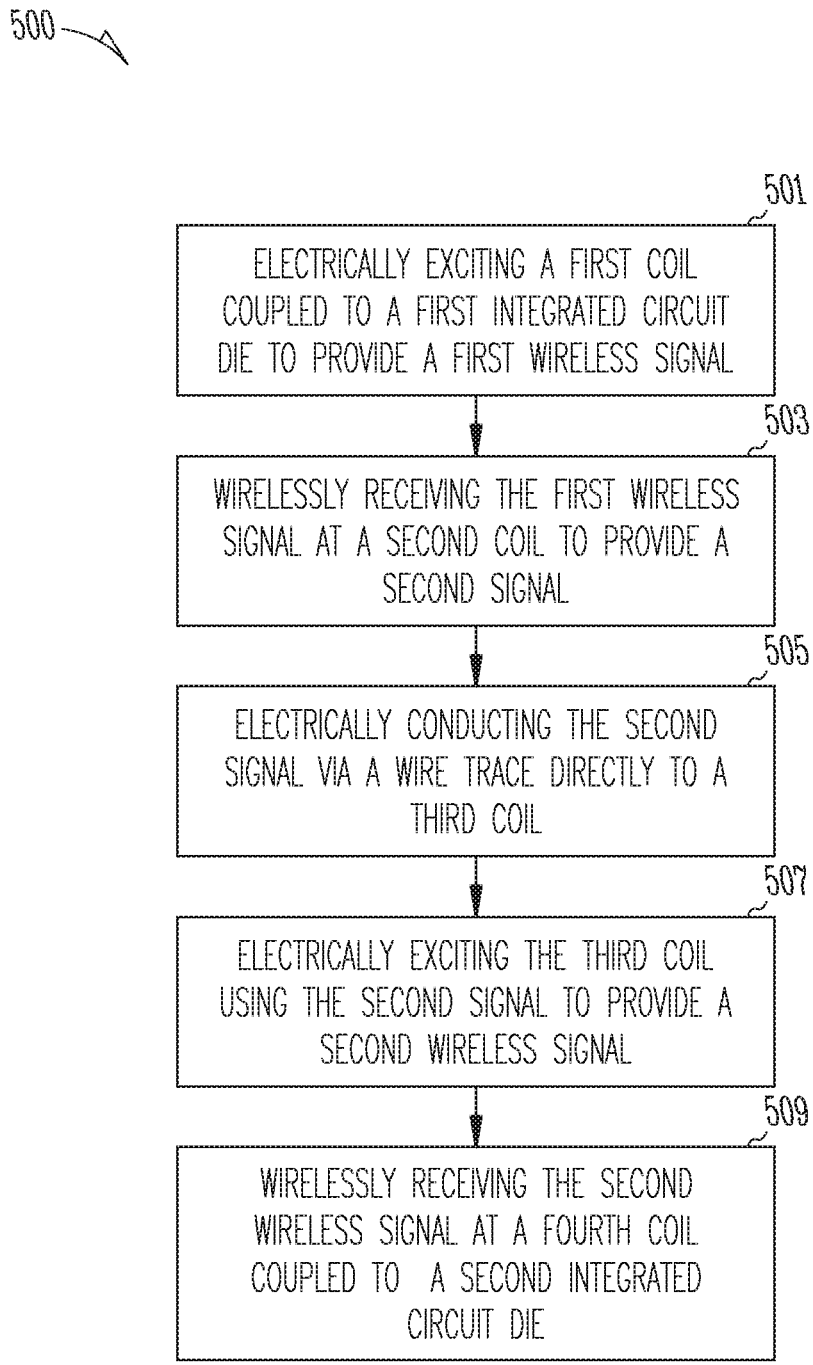
FIG. 5 illustrates generally a flowchart of an example method of operating an example apparatus according various examples of the present subject matter.

FIG. 5 illustrates generally a flowchart of an example method 500 of operating an example apparatus according various examples of the present subject matter. At 501, a first coil can be electrically excited to provide or transmit a first wireless signal. The coil can be coupled to a first integrated circuit die. In certain examples, the coil, or inductor, can be coupled to a transmitter, receiver, transceiver or combination thereof of the first integrated circuit die. At 503, a second coil can wirelessly receive the first wireless signal such as by inductive coupling, electromagnetic coupling, or combinations thereof to provide a second signal. At 505, the second signal can be electrically conducted via a wire, a conductive wire, a conductive trace of combination thereof directly to a third coil. For example, the second and third coil can be directly electrically coupled using a wire-type medium. At 507, the second signal can electrically excite the third coil to provide a second wireless signal. At 509, a fourth coil can wirelessly receive the second wireless signal such as by inductive coupling, electromagnetic coupling, or combinations thereof. The fourth coil can be coupled to a second integrated circuit die or a location of the first integrated circuit die remote from the location of the first coil. In certain examples, the fourth coil can be coupled to a second transmitter, receiver or transceiver and information can be passed between the first and second integrated circuit dies using the wireless link. Such signal communication can eliminate some external terminations of an integrated circuit system or some internal routings of an integrated circuit die such that smaller integrated packages can be realized as well as less complicated integrated circuit routing and less complicated printed circuit boards.

In the examples discussed above, routing signals wirelessly to the substrate can free up die space for additional circuitry or can reduce the overall size of a die. In some examples, routing signals wirelessly to the substrate can result in a less complex die as some signal routing and associated processing can be eliminated especially some cost intensive multi-layer interconnect redistribution processes.

ADDITIONAL EXAMPLES AND NOTES

In Example 1, an apparatus can include a first integrated circuit die including a plurality of integrated circuit devices, a second integrated circuit die including a second plurality of integrated circuit devices, and a conductor device configured to wirelessly receive a signal from the first integrated circuit die, to conduct the signal from a first end of an electrical conductor of the conductor device to a second end of the electrical conductor, and to wirelessly transmit the signal to the second integrated circuit die from the second end of the electrical conductor.

In Example 2, the first integrated circuit die of Example 1 optionally includes a first coil configured to inductively couple with a second coil at the first end of the conductive device.

In Example 3, the apparatus of any one or more of Examples 1-2 optionally includes a non-conductive material positioned between the first coil and the second coil, the non-conductive material configured to enhance mutual inductance between the first coil and the second coil compared to an air gap between the first coil and the second coil.

In Example 4, the second integrated circuit device of any one or more of Examples 1-3 optionally includes a third coil configured to inductively couple with a fourth coil at the second end of the conductive device.

In Example 5, the apparatus of any one or more of Examples 1-2 optionally includes a non-conductive material positioned between the third coil and the fourth coil, the non-conductive material configured to enhance mutual inductance between the third coil and the fourth coil compared to an air gap between the third coil and the fourth coil.

In Example 6, the first integrated circuit die and the second integrated circuit die of any one or more of Examples 1-5 optionally are the same die.

In Example 7, a printed circuit board optionally includes the conductive device of any one or more of Examples 1-6.

In Example 8, the conductive device of any one or more of Examples 1-7 optionally includes a trace of the printed circuit board.

In Example 9, the first integrated circuit die of any one or more of Examples 1-8 optionally includes a mother integrated circuit die, and the second integrated circuit die of any one or more of Examples 1-8 optionally includes a daughter integrated circuit die, the daughter integrated circuit die coupled to the mother integrated circuit die.

In Example 10, the first integrated circuit die of any one or more of Examples 1-9 optionally includes a daughter integrated circuit die, the daughter integrated circuit die coupled to a mother integrated circuit die.

In Example 11, the daughter integrated circuit die of any one or more of Examples 1-10 optionally is coupled face-up with the mother integrated circuit die.

In Example 12, the second integrated circuit die of any one or more of Examples 1-11 optionally is the mother integrated circuit die.

In Example 13, the apparatus of any one or more of Examples 1-12 optionally includes a semiconductor substrate that includes an electrically conductive portion of the conductor device.

In Example 14, a method can include electrically exciting a first coil coupled to a first integrated circuit die to provide a first wireless signal, receiving the first wireless signal at a second coil to provide a second signal, electrically conducting the second signal via a wire trace directly to a third coil, electrically exciting the third coil using the second signal to provide a second wireless signal, and wireless receiving the second wireless signal at a fourth coil, the fourth coil coupled to a second integrated circuit die.

In Example 15, the conducting the second signal of any one or more of Examples 1-14 optionally includes conducting the second signal via wire trace of a printed circuit board.

In Example 16, the second integrated circuit die of any one or more of Examples 1-15 optionally includes an area of the first integrated circuit die remote from a location of the first coil.

In Example 17, the first integrated circuit die of any one or more of Examples 1-16 optionally includes a daughter integrated circuit die, the daughter integrated circuit die coupled to a mother integrated circuit die.

In Example 18, the daughter integrated circuit die of any one or more of Examples 1-17 optionally is coupled face-up with the mother integrated circuit die.

In Example 19, the second integrated circuit die of any one or more of Examples 1-18 optionally is the mother integrated circuit die.

In Example 20, the first integrated circuit die includes of any one or more of Examples 1-19 optionally a mother integrated circuit die, and the second integrated circuit die of any one or more of Examples 1-19 optionally includes a daughter integrated circuit die, In Example 21, the conducting the second signal of any one or more of Examples 1-20 optionally includes conducting the second signal via wire trace of a semiconductor substrate.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are legally entitled.

What is claimed is:

1. An apparatus to provide a simple and elegant wireless connection between integrated circuit dies, the apparatus comprising:
    a first integrated circuit die including a plurality of integrated circuit devices and a first coil;
    a second integrated circuit die including a second plurality of integrated circuit devices and a second coil; and
    a wire;
    a third coil coupled directly to a first end of the wire;
    a fourth coil coupled directly to a second end of the wire; and
    wherein the wire, the third coil, and the fourth coil are configured to wirelessly receive a signal from the first coil at the third coil, to conduct the signal from the first end of the wire to the second end of the wire, and to wirelessly transmit the signal from the fourth coil to the second coil.

2. The apparatus of claim 1, wherein the wire does not include an amplifier.

3. The apparatus of claim 1, including a non-conductive material positioned between the first coil and the third coil, the non-conductive material configured to enhance mutual inductance between the first coil and the second coil compared to an air gap between the first coil and the third coil.

4. The apparatus of claim 1, including a non-conductive material positioned between the second coil and the fourth coil, the non-conductive material configured to enhance mutual inductance between the second coil and the fourth coil compared to an air gap between the third coil and the fourth coil.

5. The apparatus of claim 1, wherein the first integrated die and the second integrated circuit die are the same die.

6. The apparatus of claim 1, wherein a printed circuit board includes the wire.

7. The apparatus of claim 1, wherein the first integrated circuit die includes a mother integrated circuit die, and the second integrated circuit die includes a daughter integrated circuit die, the daughter integrated circuit die coupled to the mother integrated circuit die.

8. The apparatus of claim 1, wherein the first integrated circuit die includes a daughter integrated circuit die, the daughter integrated circuit die coupled to a mother integrated circuit die.

9. The apparatus of claim 8, wherein the daughter integrated circuit die is coupled face-up with the mother integrated circuit die.

10. The apparatus of claim 8, wherein the second integrated circuit die is the mother integrated circuit die.

11. The apparatus of claim 1, including a semiconductor substrate that includes an electrically conductive portion of the wire.

12. A method comprising:
    electrically exciting a first coil coupled to a first integrated circuit die to provide a first wireless signal;
    receiving the first wireless signal at a second coil to provide a second signal, the second coil coupled directly to a wire trace;
    electrically conducting the second signal via the wire trace directly to a third coil, the third coil coupled directly to the wire trace;
    electrically exciting the third coil using the second signal to provide a second wireless signal; and
    wireless receiving the second wireless signal at a fourth coil, the fourth coil coupled to a second integrated circuit die.

13. The method of claim 12, wherein the trace is a wire trace of a printed circuit board; and wherein conducting the second signal includes conducting the second signal via the wire trace of the printed circuit board.

14. The method of claim 12, wherein the second integrated circuit die includes an area of the first integrated circuit die remote from a location of the first coil.

15. The method of claim 12, wherein the first integrated circuit die includes a daughter integrated circuit die, the daughter integrated circuit die coupled to a mother integrated circuit die.

16. The method of claim 15, wherein the daughter integrated circuit die is coupled face-up with the mother integrated circuit die.

17. The method of claim 15, wherein the second integrated circuit die is the mother integrated circuit die.

18. The method of claim 12, wherein the first integrated circuit die includes a mother integrated circuit die, and the second integrated circuit die includes a daughter integrated circuit die.

19. The method of claim 12, wherein the trace is a wire trace of a semiconductor substrate; and wherein conducting the second signal includes conducting the second signal via the wire trace of the semiconductor substrate.

* * * * *